United States Patent
Feng et al.

(10) Patent No.: US 12,543,491 B2
(45) Date of Patent: Feb. 3, 2026

(54) DISPLAY MODULE AND TERMINAL DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Binfeng Feng, Beijing (CN); Yihao Zhao, Beijing (CN); Fei Li, Beijing (CN); Zhicai Xu, Beijing (CN); Shangnan Jin, Beijing (CN); Tianfu Wang, Beijing (CN); Bowen Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 426 days.

(21) Appl. No.: 18/256,240

(22) PCT Filed: Jun. 29, 2022

(86) PCT No.: PCT/CN2022/102525
§ 371 (c)(1),
(2) Date: Jun. 7, 2023

(87) PCT Pub. No.: WO2024/000318
PCT Pub. Date: Jan. 4, 2024

(65) Prior Publication Data
US 2024/0373731 A1  Nov. 7, 2024

(51) Int. Cl.
*H10K 77/10* (2023.01)
*H10K 59/131* (2023.01)
(Continued)

(52) U.S. Cl.
CPC ......... *H10K 77/111* (2023.02); *H10K 59/131* (2023.02); *H10K 59/40* (2023.02);
(Continued)

(58) Field of Classification Search
CPC .... H10K 77/111; H10K 59/131; H10K 59/40; H10K 59/871; H10K 59/8791; H10K 2102/311; H10K 59/8792; G06F 1/16
See application file for complete search history.

(56) References Cited

U.S. PATENT DOCUMENTS 11,899,862 B2 * 2/2024 Bok .................. H04N 23/57
2016/0035801 A1 2/2016 Kim
(Continued)

FOREIGN PATENT DOCUMENTS

CN  106453699 A  2/2017
CN  207319592 U  5/2018
(Continued)

*Primary Examiner* — J.E. Schoenholtz
(74) *Attorney, Agent, or Firm* — Dority & Manning, P.A.

(57) ABSTRACT

A display module includes a flexible display substrate and a touch functional layer. The flexible display substrate has a light-transmitting display region and a main display region. A light transmittance of a portion of the flexible display substrate located in the light-transmitting display region is greater than a light transmittance of a portion of the flexible display substrate located in the main display region. The touch functional layer is located on a display side of the flexible display substrate, and exposes at least part of the portion of the flexible display substrate located in the light-transmitting display region. The display module has a first region and a second region adjacent to the first region. The display module is bent towards a direction away from the display side of the flexible display substrate in the first region.

20 Claims, 8 Drawing Sheets

(51) Int. Cl.
*H10K 59/40* (2023.01)
*H10K 59/80* (2023.01)
*H10K 102/00* (2023.01)

(52) U.S. Cl.
CPC ....... *H10K 59/871* (2023.02); *H10K 59/8791* (2023.02); *H10K 2102/311* (2023.02)

(56) References Cited

U.S. PATENT DOCUMENTS

| | | |
|---|---|---|
| 2020/0328373 A1 | 10/2020 | Huang et al. |
| 2021/0191546 A1 | 6/2021 | Zhang et al. |
| 2021/0376267 A1 | 12/2021 | Zhang et al. |
| 2021/0385314 A1 | 12/2021 | An et al. |
| 2022/0308628 A1 | 9/2022 | Jin |
| 2023/0157124 A1* | 5/2023 | Park ................ G06F 3/0412 345/173 |
| 2024/0251596 A1* | 7/2024 | You .................. H10K 59/8731 |

FOREIGN PATENT DOCUMENTS

| | | |
|---|---|---|
| CN | 209980216 U | 1/2020 |
| CN | 111584740 A | 8/2020 |
| CN | 111833737 A | 10/2020 |
| CN | 113674642 A | 11/2021 |
| CN | 113990194 A | 1/2022 |
| KR | 101558395 B1 | 10/2015 |

* cited by examiner

DISPLAY MODULE AND TERMINAL DEVICE

CROSS-REFERENCE TO RELATED APPLICATION

This application is a national phase entry under 35 USC 371 of International Patent Application No. PCT/CN2022/102525, filed on Jun. 29, 2022, which is incorporated herein by reference in its entirety.

TECHNICAL FIELD

The present disclosure relates to the field of display technologies, and in particular, to a display module and a terminal device.

BACKGROUND

Organic light-emitting diode (OLED) display modules have advantages of self-illumination, high luminous efficiency, energy saving, good flexibility, and wide range of adaptability to ambient temperature, and are therefore widely used in various occasions. With the development of display technology and the upgrading of user needs, the screen-to-body ratio of the OLED display module tends to become larger and larger, and the application of under-screen camera in the OLED display module (e.g., full screen) with a large screen-to-body ratio has become more and more extensive.

SUMMARY

In an aspect, a display module is provided. The display module includes a flexible display substrate and a touch functional layer. The flexible display substrate has a light-transmitting display region and a main display region, and the main display region is located on at least one side of the light-transmitting display region. A light transmittance of a portion of the flexible display substrate located in the light-transmitting display region is greater than a light transmittance of a portion of the flexible display substrate located in the main display region. The touch functional layer is located on a display side of the flexible display substrate. The touch functional layer exposes at least part of the portion of the flexible display substrate located in the light-transmitting display region. The display module has a first region and a second region. The display module is bent towards a direction away from the display side of the flexible display substrate in the first region. The first region is disposed adjacent to the second region. The light-transmitting display region of the flexible display substrate is located in the first region, and the main display region of the flexible display substrate is located in both the second region and a region in the first region other that the light-transmitting display region.

In some embodiments, the touch functional layer covers at least part of the portion of the flexible display substrate located in the main display region, and exposes the portion of the flexible display substrate located in the light-transmitting display region.

In some embodiments, the flexible display substrate includes a plurality of sub-pixels. A distance between two adjacent sub-pixels in the light-transmitting display region is larger than a distance between two adjacent sub-pixels in the main display region.

In some embodiments, the flexible display substrate includes a plurality of sub-pixels, and each sub-pixel includes a light-emitting device and a pixel circuit coupled to the light-emitting device. At least some of pixel circuits respectively coupled to light-emitting devices located in the light-transmitting display region are located in the main display region.

In some embodiments, the display module further includes a light-transmitting film. The light-transmitting film covers a portion of the flexible display substrate located in the first region. The touch functional layer covers a portion of the flexible display substrate located in the second region, and the touch functional layer and the light-transmitting film are disposed in a same layer.

In some embodiments, the display module further includes an anti-reflection layer. The anti-reflection layer is disposed on the display side of the flexible display substrate. The touch functional layer is located between the anti-reflection layer and the flexible display substrate.

In some embodiments, the display module further includes an anti-reflection layer. The anti-reflection layer is disposed on the display side of the flexible display substrate. The touch functional layer is located on a side of the anti-reflection layer away from the flexible display substrate, and covers a portion of the flexible display substrate located in the second region.

In some embodiments, the display module further includes a first cover plate. The first cover plate is located on the display side of the flexible display substrate, and covers a portion of the flexible display substrate located in the first region. The first cover plate is disposed on a same layer as the touch functional layer.

In some embodiments, the display module further includes a sealant. The sealant is located between the touch functional layer and the first cover plate, and is bonded to the touch functional layer and the first cover plate in a sealing manner.

In some embodiments, the display module further includes a first cover plate. The first cover plate is located on the display side of the flexible display substrate, and covers portions of the flexible display substrate located in the first region and the second region.

In some embodiments, the display module further includes a first cover plate and a first light-shielding ink. The first cover plate is located on the display side of the flexible display substrate, and covers a portion of the flexible display substrate located in the first region or covers portions of the flexible display substrate located in the first region and the second region. The first light-shielding ink is located on a surface of the first cover plate proximate to the flexible display substrate, or is located on a surface of the first cover plate away from the flexible display substrate. The first light-shielding ink is located at least in the first region, and an orthogonal projection of the first light-shielding ink on the first cover plate covers a border of the first cover plate.

In some embodiments, the display module further includes a second cover plate. The second cover plate is located on the display side of the flexible display substrate and covers a portion of the touch functional layer located in the second region.

In some embodiments, the display module further includes a second light-shielding ink. The second light-shielding ink is located on a surface of the second cover plate proximate to the flexible display substrate, or is located on a surface of the second cover plate away from the flexible display substrate. The second light-shielding ink is located in the second region, and an orthogonal projection of the second light-shielding ink on the second cover plate covers a border of the second cover plate.

In some embodiments, the display module further includes a first cover plate and a first light-shielding ink. The first cover plate is located on the display side of the flexible display substrate, and covers a portion of the flexible display substrate located in the first region or covers portions of the flexible display substrate located in the first region and the second region. The first light-shielding ink is located on a surface of the first cover plate proximate to the flexible display substrate, or located on a surface of the first cover plate away from the flexible display substrate. The first light-shielding ink is located at least in the first region, and an orthogonal projection of the first light-shielding ink on the first cover plate covers a border of the first cover plate. The first light-shielding ink and the second light-shielding ink are disposed in different layers.

In some embodiments, a dimension of a portion of the display module located in the second region in a direction perpendicular to a portion of the flexible display substrate in the second region is greater than a dimension of a portion of the display module in the first region in a direction perpendicular to a portion of the flexible display substrate in the first region.

In some embodiments, the display module further includes a display driving chip and a chip on film. The display driving chip is located on a back side of the flexible display substrate. An end of the chip on film is coupled to the flexible display substrate, and another end of the chip on film is bent towards the back side of the flexible display substrate and coupled to the display driving chip.

In some embodiments, the display module further includes a display driving chip and a chip on panel. The display driving chip is located on a back side of the flexible display substrate. An end of the chip on panel is coupled to the flexible display substrate, and another end of the chip on panel is bent towards the back side of the flexible display substrate and coupled to the display driving chip. The chip on panel and the flexible display substrate are connected to be an integral structure.

In some embodiments, the flexible display substrate includes a display functional layer and a back film. The display functional layer is configured to emit light for display. The back film is located on a back surface of the display functional layer. The back film includes a first film segment attached to the display functional layer, a second film segment located on the back side of the flexible display substrate, and a third film segment connected between the first film segment and the second film segment. A thickness of the third film segment is less than a thickness of the first film segment and/or the thickness of the third film segment is less than a thickness of the second film segment.

In some embodiments, the display module further includes a support plate. The support plate is disposed on a back side of the flexible display substrate and includes a bending support portion. The bending support portion is located at a position where the first region is proximate to the second region, and is bent towards the direction away from the display side of the flexible display substrate. The bending support portion is provided with a concave structure therein.

In another aspect, a terminal device is provided. The terminal device includes the display module as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these accompanying drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
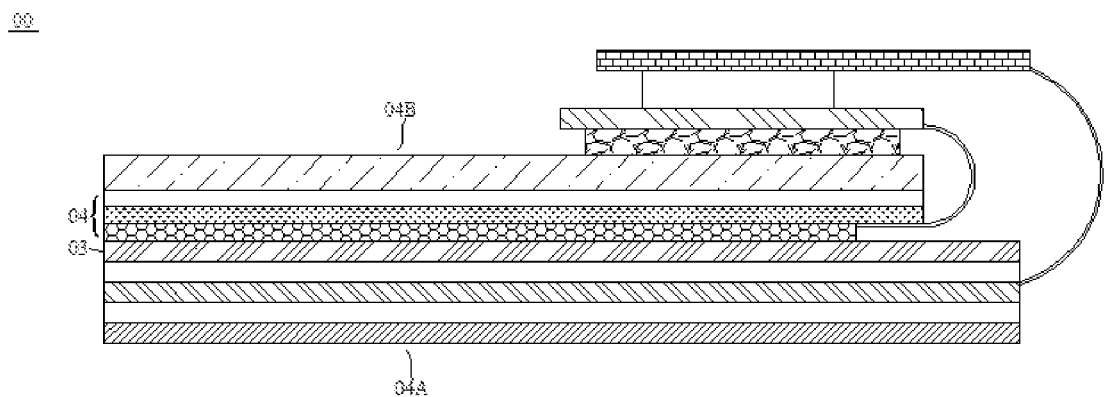
FIG. 1 is a sectional view of a display module, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, unless otherwise specified, the term "a plurality of" or "the plurality of" means two or more.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected" or "in response to detecting [the stated condition or event]".

The phrase "applicable to" or "configured to" as used herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values beyond those stated.

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

With the development of organic light-emitting diode (OLED) display technology and the smart car industry, a terminal device with an under-screen camera may be installed in a vehicle to save the available space inside the vehicle. The terminal device with the under-screen camera may monitor the driving state of the driver or the riding conditions of other passengers in real time through the under-screen camera while displaying display images such as vehicle state information and navigation map information.

FIG. 1 is sectional view of a display module provided by some embodiments of the present disclosure.

Referring to FIG. 1, some embodiments of the present disclosure provide a display module 00. The display module 00 is a display assembly capable of displaying images. For example, the display module 00 may be a liquid crystal display module or an organic light-emitting display module.

Referring to FIG. 1, the display module 00 includes a touch functional layer 03 and a flexible display substrate 04. The flexible display substrate 04 has a display side 04A and a back side 04B (i.e., a side opposite to the display side 04A of the flexible display substrate 04). The display side 04A is a side where the flexible display substrate 04 can display images, and the human eye can see images displayed on the flexible display substrate 04 when it is located on the display side 04A. The back side 04B is opposite to the display side 04A. The touch functional layer 03 is disposed on the display side 04A of the flexible display substrate 04. The touch functional layer 03 may be a touch panel, such as a capacitive touch panel or a resistive touch panel.

However, it is found through research by the inventors that before light from a display side of the terminal device reaches the under-screen camera, it needs to pass through the touch functional layer, the flexible display substrate, and other structures in the terminal device. The light loss may be caused due to blocking or reflection of light by the touch functional layer and the flexible display substrate, so that the amount of light collected by the under-screen camera may be reduced, thereby causing a poor effect of image acquisition by the under-screen camera.

Figure 2:
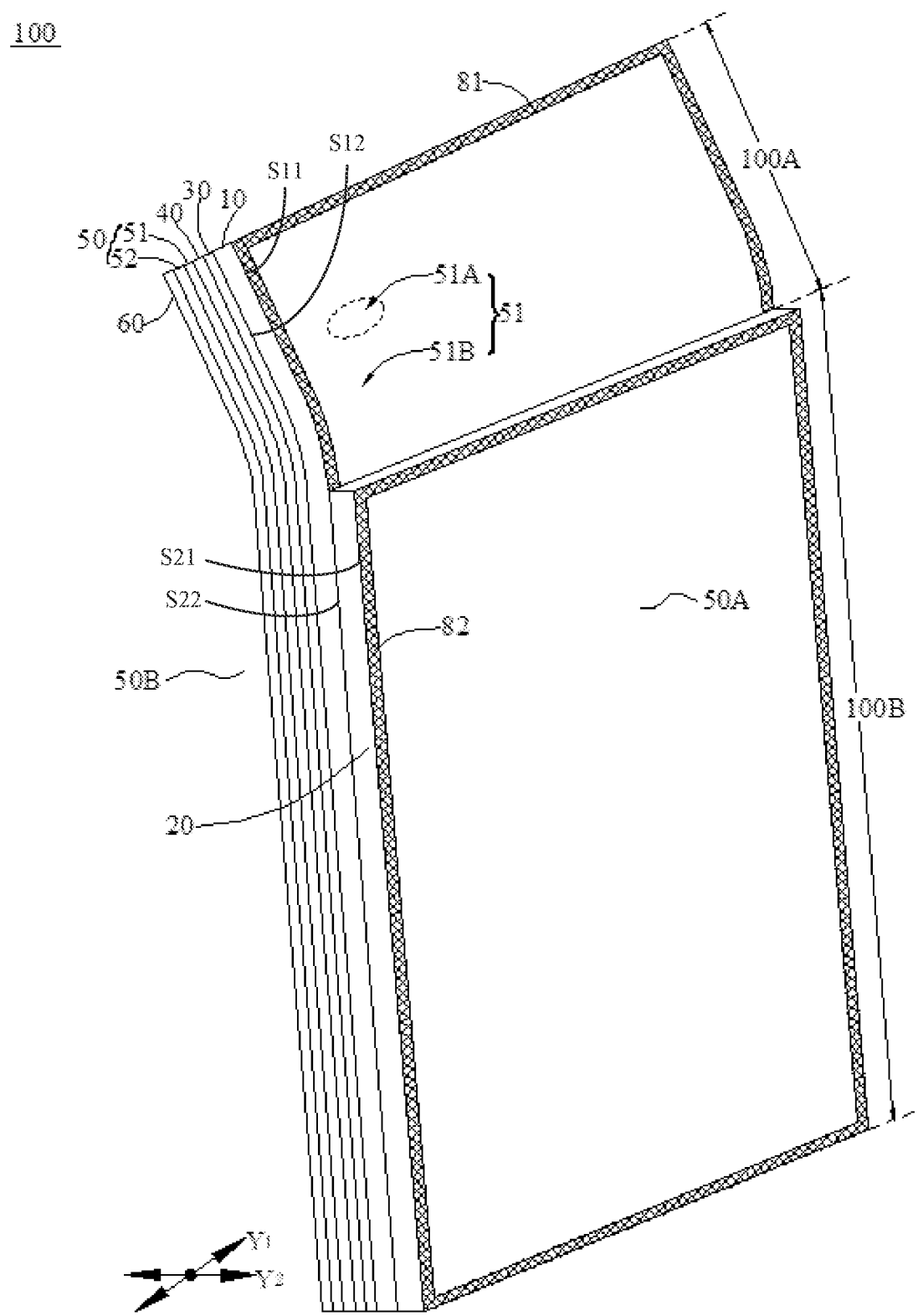
FIG. 2 is a perspective view of a display module, in accordance with some embodiments.
Figure 3:
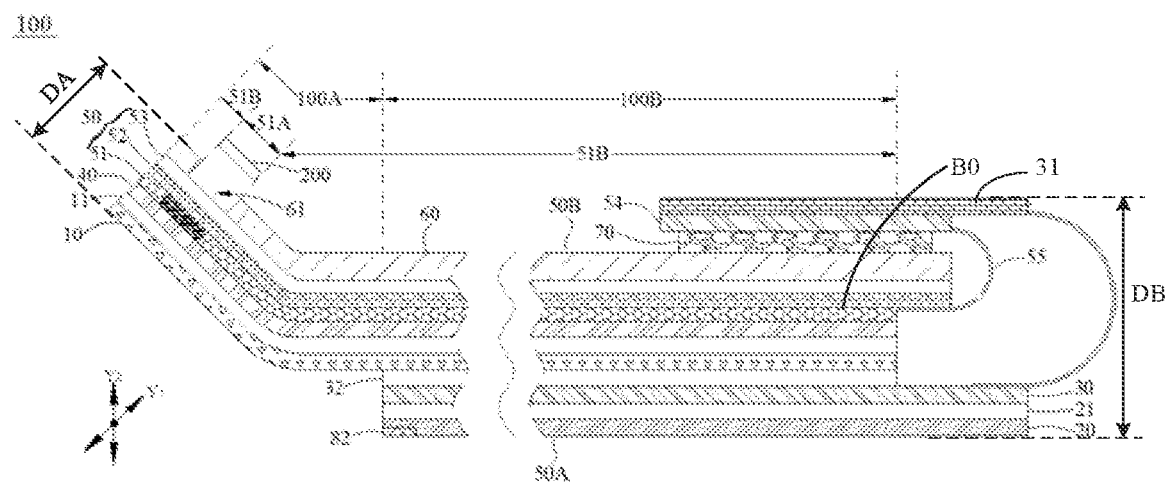
FIG. 3 is a sectional view of another display module, in accordance with some embodiments.

FIG. 2 is a perspective view of a display module in accordance with some embodiments. FIG. 3 is a sectional view of a display module in accordance with some embodiments.

Based on this, as shown in FIG. 2, embodiments of the present disclosure provide a display module 100. The display module 100 may be included in a terminal device, and the terminal device may be a wearable device, a mobile phone, a television, a vehicle-mounted terminal device, and the like.

In some embodiments, as shown in FIGS. 2 and 3, the display module 100 includes a flexible display substrate 50, a touch functional layer 30, an anti-reflection layer 40, a first cover plate 10, a second cover plate 20, a support plate 60 and an optical sensor 200.

The optical sensor 200 may be disposed on a back side 50B of the flexible display substrate 50. The optical sensor 200 may be an optical image sensor, a transmissive optical sensor, an optical measurement sensor, an optical mouse sensor, or a reflective optical sensor, etc. For example, the optical sensor 200 is an optical fingerprint sensor, a camera, or a monitor.

The support plate 60 is disposed on the back side 50B of the flexible display substrate 50. For example, the support plate 60 is located between the flexible display substrate 50 and the optical sensor 200. The support plate 60 is provided with an opening 61, and at least part of an orthogonal projection of the optical sensor 200 on the support plate 60 falls into the opening 61. For example, the support plate 60 may be an aluminum alloy support plate or a copper alloy support plate, which is configured to carry and support the flexible display substrate 50.

For example, the flexible display substrate 50 and the support plate 60 may be attached together through a first adhesive layer 53, which may improve connection reliability between the flexible display substrate 50 and the support plate 60.

The first adhesive layer 53 may be made of an optical clear adhesive (OCA), a liquid optical clear adhesive, an optical clear resin (OCR) or a pressure sensitive adhesive.

The flexible display substrate 50 may be a flexible organic light-emitting display substrate. In some embodiments, as shown in FIG. 2, the flexible display substrate 50 includes a display functional layer 51 and a back film 52.

Figure 5:
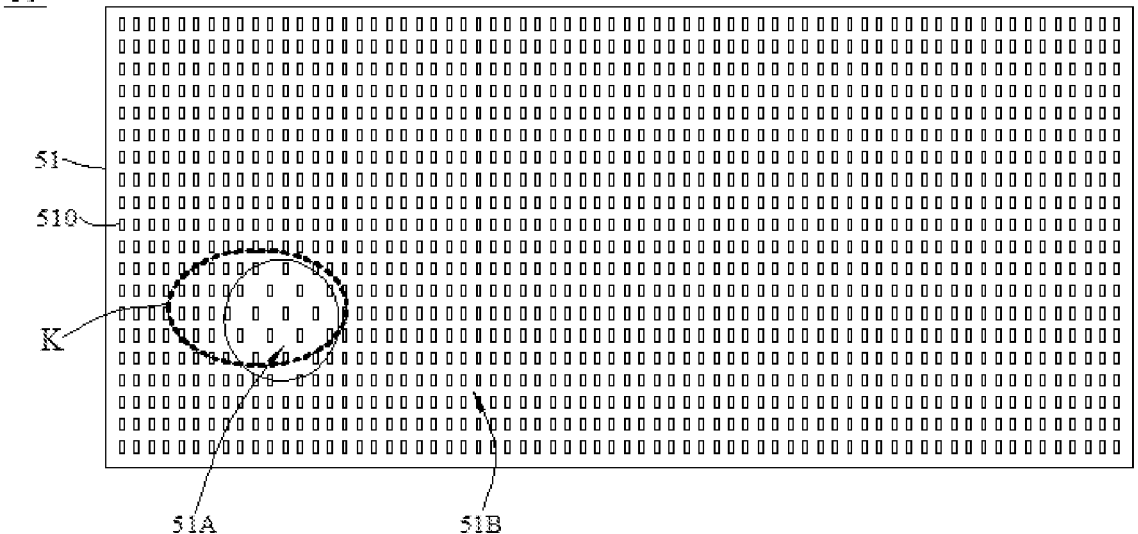
FIG. 5 is a top view of a flexible display substrate in a display module, in accordance with some embodiments.

As shown in FIG. 5, the flexible display substrate 50 includes a plurality of sub-pixels 510. It can be understood that the display functional layer 51 includes the plurality of sub-pixels 510. The plurality of sub-pixels 510 are arranged in an array in a display region of the flexible display substrate 50. For example, a typical sub-pixel 510 includes a red (R) sub-pixel, a green (G) sub-pixel and a blue (B) sub-pixel. The plurality of sub-pixels 510 in the flexible display substrate 50 may be arranged in various ways, and the arrangement of the plurality of sub-pixels 510 may include an arrangement in which red sub-pixels and blue sub-pixels are arranged alternately and any adjacent red sub-pixel and blue sub-pixel is provided with a green sub-pixel therebetween (abbreviated to an RGBG pixel arrangement), an arrangement in which adjacent sub-pixels are shared horizontally (e.g., an RGB-Delta pixel arrangement), an arrangement in which adjacent sub-pixels are shared vertically (e.g., an RGB-Pentile pixel arrangement), and the like.

Figure 7:
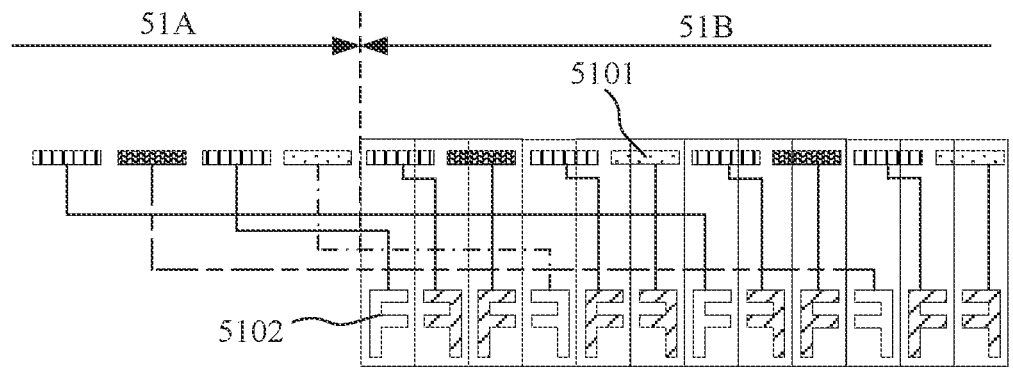
FIG. 7 is a structural diagram of a flexible display substrate in a display module, in accordance with some embodiments.

As shown in FIG. 7, the sub-pixel 510 includes a light-emitting device 5101 and a pixel circuit 5102, the light-emitting device 5101 is coupled to the pixel circuit 5102, and the pixel circuit 5102 is configured to drive the light-emitting device 5101 to emit light for display. For example, the pixel circuit 5102 may be of a "6T1C", "7T1C", "6T2C" or "7T2C" structure, where "T" represents a thin film transistor, and the number in front of "T" represents the number of the thin film transistors; "C" represents a storage capacitor, and the number in front of "C" represents the number of the storage capacitors.

Figure 8:
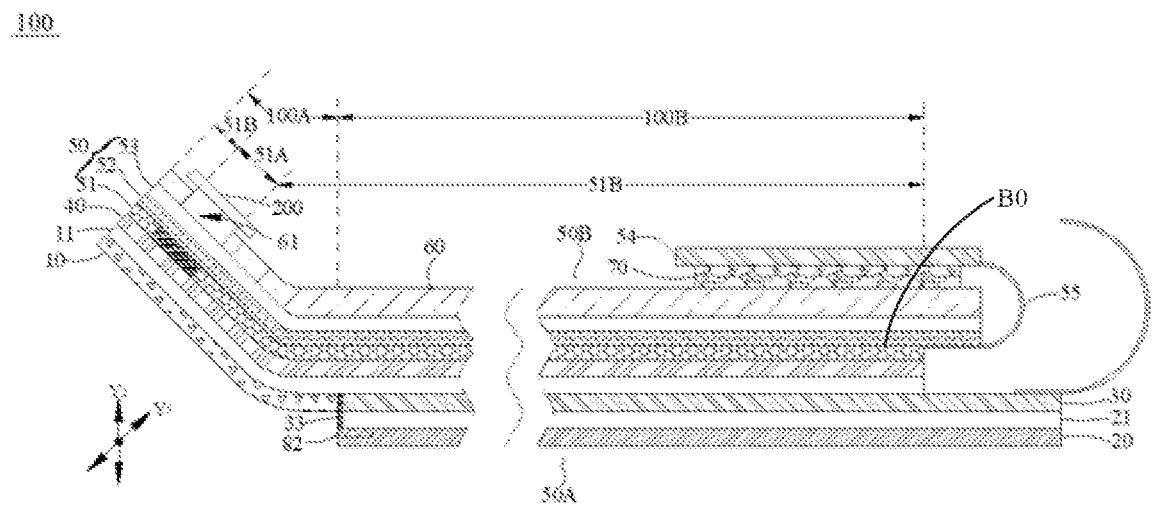
FIG. 8 is a sectional view of yet another display module, in accordance with some embodiments.

As shown in FIGS. 3 and 8, the back film 52 is located on a back surface B0 of the display functional layer 51. For example, the back film 52 may be made of polyimide (PI) or polyethylene terephthalate (PET), which has a high light transmittance. The back film 52 is configured to reduce damage by external pressure to the display module 100 during bending or use, thereby improving the reliability and stability of the display module 100.

As shown in FIGS. 3 and 8, the touch functional layer 30 is located on a display side 50A of the flexible display substrate 50. It can be understood that the touch functional layer 30 is located on a display side of the display functional layer 51. The touch functional layer 30 may be various in type, which may be selected according to actual needs. For example, the touch functional layer 30 may be a capacitive touch functional layer. When the display module 100 is pressed by a finger or a stylus, a value of capacitance between a first touch electrode and a second touch electrode in the touch functional layer 30 at touch point may be changed, and the position of the touch point may be determined by detecting the change of the value of the capacitance.

As shown in FIG. 8, the anti-reflection layer 40 is disposed on the display side 50A of the flexible display substrate 50. It can be understood that the anti-reflection layer 40 is located on the display side of the display functional layer 51.

The anti-reflection layer 40 may be a polarizer or a filter film. The anti-reflection layer 40 may make the light emitted by the light-emitting device in the flexible display substrate 50 become polarized light, so as to reduce or even suppress the reflection of the light emitted by the light-emitting device in the flexible display substrate 50, and enhance the transmission of the light emitted by the light-emitting device in the flexible display substrate 50. Therefore, the anti-reflection layer 40 may improve the display effect of the display module 100.

As shown in FIGS. 3 and 8, the first cover plate 10 is located on the display side 50A of the flexible display substrate 50. The first cover plate 10 may protect structures such as the light-emitting device 5101 and the pixel circuit 5102 in the flexible display substrate 50 from being damaged.

For example, the first cover plate 10 may be a flexible transparent cover plate such as a flexible glass cover plate, and may be made of a transparent PI film, a transparent PET film, an ultra-thin glass (UTG), or the like. The first cover plate 10 has good flexibility, wear resistance and light transmittance. For example, the first cover plate 10 may be a single-layer transparent PI film or a single-layer UTG; or may have a double-layer structure of transparent PI films bonded by optically clear adhesive (OCA), a double-layer structure of a transparent PI film and a transparent PET film bonded by OCA, a double-layer structure of a transparent PI film and a transparent PET film bonded by thermoplastic polyurethanes (TPU) elastomer, or a double-layer structure of an UTG and a PET film bonded by TPU adhesive.

As shown in FIGS. 3 and 8, the second cover plate 20 is located on a side of the first cover plate 10 away from the flexible display substrate 50. For example, the second cover plate 20 may be a rigid transparent cover plate, such as a rigid glass cover plate or a rigid quartz cover plate. A thickness of the second cover plate 20 may be greater than or equal to a thickness of the first cover plate 10. The second cover plate 20 has good wear resistance and bearing capacity, and is configured to cover and protect the flexible display substrate 50, the touch functional layer 30, the anti-reflection layer 40 and the first cover plate 10, which may improve the compressive capacity of the display module 100.

Figure 4:
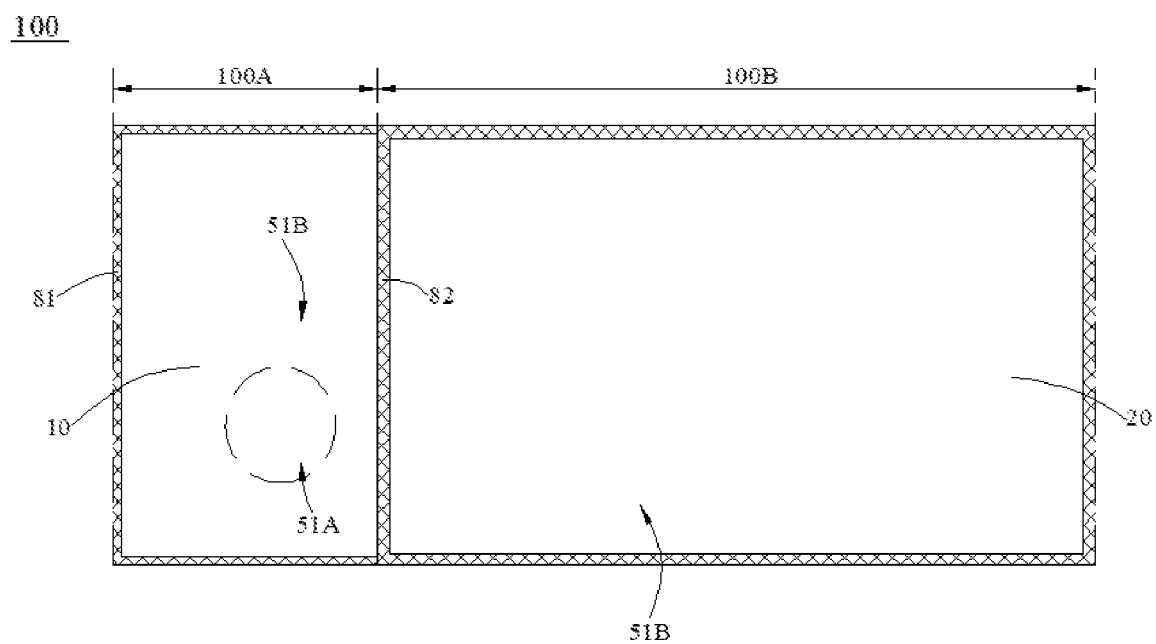
FIG. 4 is a top view of a display module, in accordance with some embodiments.

In some embodiments, as shown in FIGS. 3, 4 and 5, the flexible display substrate 50 includes a light-transmitting display region 51A and a main display region 51B.

For example, the light-transmitting display region 51A may be in a shape of a circle, an ellipse, a rectangle, or other shapes (e.g., a polygon), and the main display region 51B may be in a shape of a rectangle, a polygon, or the like. For example, as shown in FIG. 5, the light-transmitting display region 51A is in the shape of the circle, the main display region 51B is in a shape of a closed figure obtained by removing a circle (light-transmitting display region 51A) from a rectangle (display region), and an area of the main display region 51B may be greater than an area of the light-transmitting display region 51A.

The main display region 51B is located on at least one side of the light-transmitting display region 51A. For example, the main display region 51B is located on one or two sides of the light-transmitting display region 51A, that is, the main display region 51B partially surrounds the light-transmitting display region 51A. For another example, the main display region 51B may be located around the light-transmitting display region 51A (including the upper and lower sides and the left and right sides), so that the main display region 51B completely surrounds the light-transmitting display region 51A.

In some examples, as shown in FIG. 3, the optical sensor 200 and the opening 61 are at least partially located in the light-transmitting display region 51A. It can be understood that an orthogonal projection of the optical sensor 200 on the flexible display substrate 50 at least partially covers the light-transmitting display region 51A. For example, the opening 61 is located in the light-transmitting display region 51A, the orthogonal projection of the optical sensor 200 on the flexible display substrate 50 completely covers the light-transmitting display region 51A, an area of the orthogonal projection of the optical sensor 200 on the flexible display substrate 50 is not less than an area of the light-transmitting display region 51A, and an area of the opening 61 is also not less than the area of the light-transmitting display region 51A. For another example, the orthogonal projection of the optical sensor 200 on the flexible display substrate 50 covers a part of the light-transmitting display region 51A, and the opening 61 is partially located in the light-transmitting display region 51A.

In some embodiments, a light transmittance of a portion of the flexible display substrate 50 located in the light-transmitting display region 51A is greater than a light transmittance of a portion of the flexible display substrate 50 located in the main display region 51B.

In some examples, as shown in FIG. 5, a sub-pixel density of sub-pixels 510 in the light-transmitting display region 51A of the flexible display substrate 50 is less than a sub-pixel density of sub-pixels 510 in the main display region 51B of the flexible display substrate 50. In this way, it is possible to reduce the blocking of light by the sub-pixels 510 in the light-transmitting display region, so that the light transmittance of the portion of the flexible display substrate 50 located in the light-transmitting display region 51A is greater than the light transmittance of the portion of the flexible display substrate 50 located in the main display region 51B.

Figure 6:
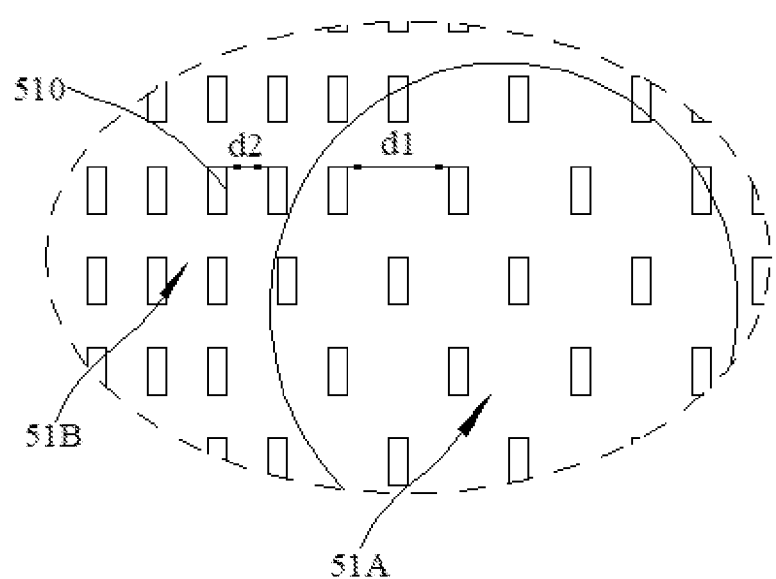
FIG. 6 is an enlarged view of the region K in FIG. 5.

In some examples, as shown in FIG. 6, a distance d1 between two adjacent sub-pixels 510 in the light-transmitting display region 51A is greater than a distance d2 between two adjacent sub-pixels 510 in the main display region 51B. For example, a ratio of the distance d1 to the distance d2 may be in a range of 1.2:1 to 2.5:1, such as 1.2:1, 1.5:1, 1.8:1, 2:1, 2.2:1, or 2.5:1.

In this example, the distance d1 between two adjacent sub-pixels 510 in the light-transmitting display region 51A is greater than the distance d2 between two adjacent sub-pixels 510 in the main display region 51B. Therefore, more light can pass through a region between two adjacent sub-pixels in the light-transmitting display region 51A, so that the light transmittance of the portion of the flexible display substrate 50 located in the light-transmitting display region 51A is greater than the light transmittance of the portion of the flexible display substrate 50 located in the main display region 51B.

In some examples, as shown in FIG. 7, at least some of the pixel circuits 5102 respectively coupled to the light-emitting devices 5101 located in the light-transmitting display region 51A are located in the main display region 51B. For example, all the pixel circuits 5102 respectively coupled to the light-emitting devices 5101 located in the light-transmitting display region 51A are located in the main display region 51B.

In this example, by reducing the number of pixel circuits 5102 located in the light-transmitting display region 51A, it is possible to reduce the blocking of light by the pixel circuits 5102 located in the light-transmitting display region 51A, so that the light transmittance of the portion of the flexible display substrate 50 located in the light-transmitting display region 51A is greater than the light transmittance of the portion of the flexible display substrate 50 located in the main display region 51B.

Of course, there may also be other examples that make the light transmittance of the portion of the flexible display substrate 50 located in the light-transmitting display region 51A greater than the light transmittance of the portion of the flexible display substrate 50 located in the main display region 51B, and the above description is merely illustrative, which is not limited thereto.

In some embodiments, as shown in FIG. 3, the touch functional layer 30 exposes at least part of the portion of the flexible display substrate 50 located in the light-transmitting display region 51A. In this way, the touch functional layer 30 may at least partially avoid the light-transmitting display region 51A, so as to reduce the blocking of light in the light-transmitting display region 51A by the touch functional layer 30, thereby improving the light transmittance of the display module 100 in the light-transmitting display region 51A.

In some examples, as shown in FIG. 3, the touch functional layer 30 exposes a whole of the portion of the flexible display substrate 50 located in the light-transmitting display region 51A. It can be understood that the touch functional layer 30 covers at least part of the portion of the flexible display substrate 50 located in the main display region 51B, and exposes the portion of the flexible display substrate 50 located in the light-transmitting display region 51A. For example, the touch functional layer 30 covers part of the portion of the flexible display substrate 50 located in the main display region 51B. For another example, the touch functional layer 30 covers a whole of the portion of the flexible display substrate 50 located in the main display region 51B.

The optical sensor 200 is located in the light-transmitting display region 51A, and the touch functional layer 30 can avoid the light-transmitting display region 51A. Therefore, the blocking of light in the light-transmitting display region 51A by the touch functional layer 30 may be eliminated, the amount of light collected by the optical sensor 200 may be improved, and thus the definition of images collected by the optical sensor 200 may be improved.

In some examples, the touch functional layer 30 exposes part of the portion of the flexible display substrate 50 located in the light-transmitting display region 51A. It can be understood that, the touch functional layer 30 extends into part of the light-transmitting display region 51A and exposes the rest of the light-transmitting display region 51A. The optical sensor 200 is located in the light-transmitting display region 51A. In this way, light in part of the light-transmitting display region 51A that is not covered by the touch functional layer 30 will not be blocked by the touch functional layer 30, which may increase the amount of light collected by the optical sensor 200 and improve the definition of images collected by the optical sensor 200.

In some embodiments, as shown in FIGS. 2, 3 and 4, the display module 100 includes a first region 100A and a second region 100B. The display module 100 is bent towards a direction away from the display side 50A of the flexible display substrate 50 in the first region 100A.

For example, as shown in FIG. 3, the flexible display substrate 50, the anti-reflection layer 40, the first cover plate 10 and the support plate 60 are all bent towards the direction away from the display side 50A of the flexible display substrate 50 in the first region 100A.

The first region 100A is adjacent to the second region 100B. It can be understood that the first region 100A is disposed on at least one side of the second region 100B.

As shown in FIG. 4, the light-transmitting display region 51A of the flexible display substrate 50 may be located in the first region 100A, and the main display region 51B of the flexible display substrate 50 may be located in both the second region 100B and a region in the first region 100A other than the light-transmitting display region 51A.

In some examples, as shown in FIG. 3, the flexible display substrate 50 includes a first flat portion and a bending portion that are located in the first region 100A, and a second flat portion that is located in the second region 100B. The bending portion connects the first flat portion with the second flat portion.

In some examples, the light-transmitting display region 51A corresponds to the first flat portion of the flexible display substrate 50 in the first region 100A, and the touch functional layer 30 covers the second flat portion located in the main display region 51B of the second region 100B. In this way, it may be possible to reduce the light loss caused by the touch functional layer 30 blocking or reflecting the light entering the light-transmitting display region 51A, and improve the amount of light collected by the optical sensor 200. Moreover, if a shooting angle of the optical sensor 200 is adjustable, relative to be located in the second region 100B, the optical sensor 200 located in the first region 100A has a wider shooting angle and is more convenient to adjust the shooting angle of the optical sensor 200.

For example, the first region 100A and the second region 100B may each be in a shape of a rectangle, a polygon, or a sector ring, and the first region 100A and the second region 100B may have different shapes.

For example, an area of the first region 100A and an area of the second region 100B may be different. For example, the area of the first region 100A is less than or equal to the area of the second region 100B. The interface content displayed on the first region 100A may also be different from the interface content displayed on the second region 100B. For example, the first region 100A displays a navigation image, and the second region 100B displays an operation interface image.

In some examples, the display module 100 is applied to the vehicle-mounted terminal device. The display module 100 may be located in the middle of a vehicle console, and the first region 100A is located on a side of the second region 100B proximate to the main driver's seat. An included angle exists between a portion of the display module 100 located in the first region 100A and a portion of the display module 100 located in the second region 100B, the light-transmitting display region 51A is located in the first region 100A, and the optical sensor 200 may collect images of the first region 100A through the light-transmitting display region 51A. For example, the optical sensor 200 may collect images of the main driver's seat through the light-transmitting display region 51A.

Figure 10:
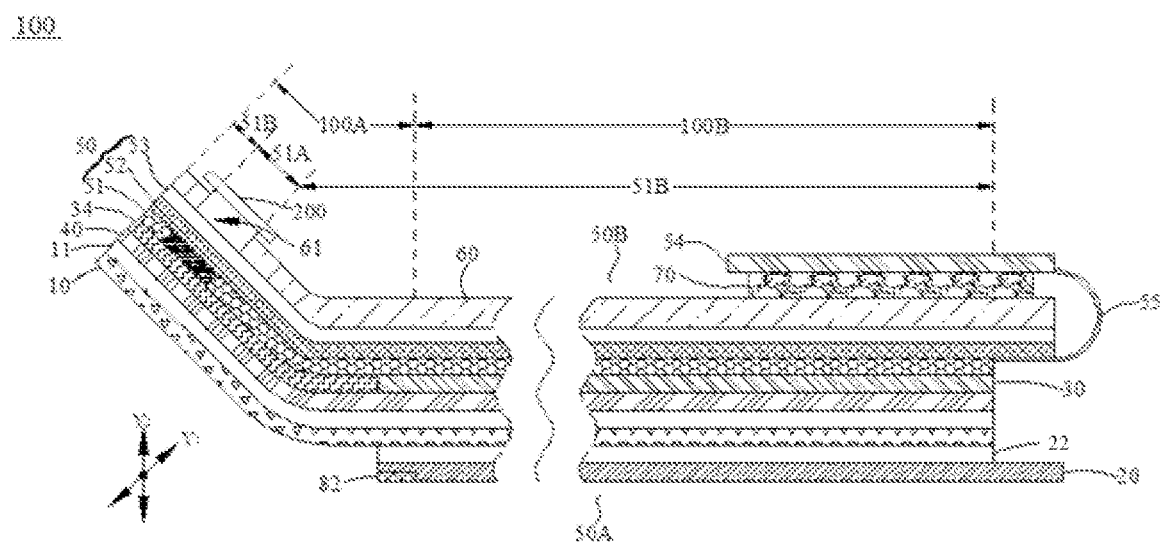
FIG. 10 is a sectional view of yet another display module, in accordance with some embodiments.

In some embodiments, as shown in FIG. 10, the display module 100 further includes a light-transmitting film 34.

For example, the light-transmitting film 34 may be a transparent polymer film, such as a polyethylene terephthalate (PET) film or a cycloolefin polymer film.

For example, the light-transmitting film 34 covers a portion of the flexible display substrate 50 located in the first region 100A. The touch functional layer 30 covers a portion of the flexible display substrate 50 located in the second region 100B.

A thickness of the light-transmitting film 34 in a first direction $Y_1$ may be the same as a thickness of the touch functional layer 30 in a second direction $Y_2$, and the touch functional layer 30 and the light-transmitting film 34 are disposed in a same layer. The touch functional layer 30 and the light-transmitting film 34 are disposed in the same layer, which may be understood that a distance from the touch functional layer 30 to the flexible display substrate 50 is the same as a distance from the light-transmitting film 34 to the flexible display substrate 50.

In some examples, as shown in FIG. 10, the touch functional layer 30 and the light-transmitting film 34 are disposed in the same layer and between the anti-reflection layer 40 and the display functional layer 51. The touch functional layer 30 is located between the anti-reflection layer 40 and the flexible display substrate 50, which may be understood that, the display module 100 includes a flexible multi-layer on cell (FMLOC) touch display panel.

The touch functional layer 30 is disposed between the anti-reflection layer 40 and the flexible display substrate 50, and there is no need to bond the anti-reflection layer 40 and the flexible display substrate 50 through an adhesive layer, which may make the display module 100 thin.

The light-transmitting film 34 has a good light transmittance and will not block light in the light-transmitting display region 51A. The touch functional layer 30 does not block the light in the light-transmitting display region 51A and will not block the light in the light-transmitting display region 51A. Therefore, the light transmittance of the portion of the display module 100 located in the light-transmitting display region 51A may be improved.

Figure 9:
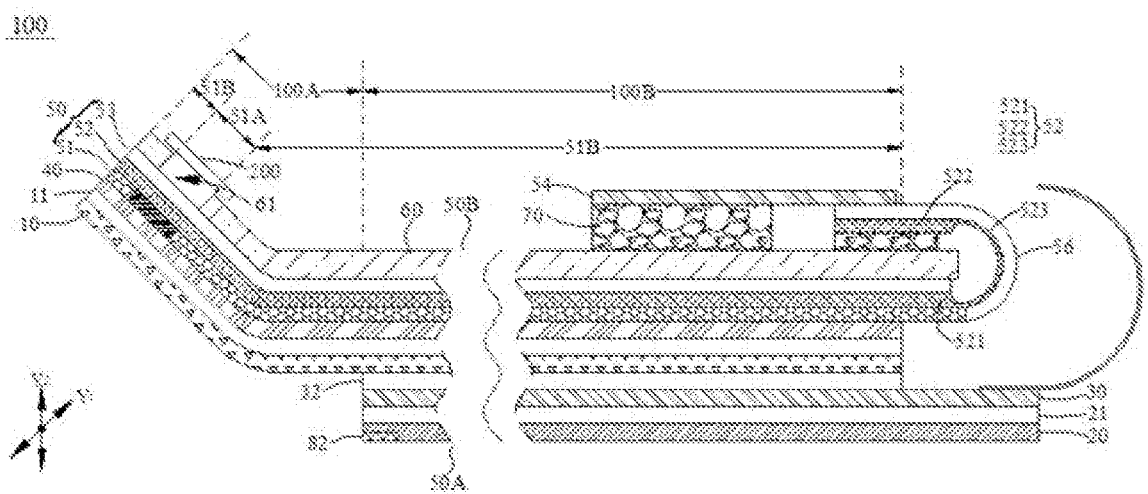
FIG. 9 is a sectional view of yet another display module, in accordance with some embodiments.

In some embodiments, as shown in FIGS. 8 and 9, the touch functional layer 30 is located on a side of the anti-reflection layer 40 away from the flexible display substrate 50 and covers the portion of the flexible display substrate 50 located in the second region 100B. It can be understood that the display module 100 is an external touch screen panel (TSP). For example, the touch functional layer 30 may be a resistive touch functional layer, a capacitive touch functional layer, a projected capacitive touch functional layer, an infrared touch functional layer, or an electromagnetic touch functional layer.

In some examples, as shown in FIG. 9, the touch functional layer 30 is located between the first cover plate 10 and the second cover plate 20, and the touch functional layer 30 covers the portion of the flexible display substrate 50 located in the second region 100B. The touch functional layer 30 may be protected by the first cover plate 10 and the second cover plate 20, and may be not easily damaged. Moreover, the touch functional layer 30 is not affected by the flexible display substrate 50, and thus has high operation stability.

The touch functional layer 30 and the first cover plate 10 may be attached through a second adhesive layer 32, so as to improve connection strength between the touch functional layer 30 and the first cover plate 10. For example, the second adhesive layer 32 may be made of the same material as the first adhesive layer 53, which may improve the connection reliability of the display module 100.

In some examples, as shown in FIG. 8, the touch functional layer 30 and the first cover plate 10 are disposed in the same layer and disposed on the side of the anti-reflection layer 40 away from the flexible display substrate 50.

A third adhesive layer 11 may be provided between the anti-reflection layer 40 and both the touch functional layer 30 and the first cover plate 10 that are disposed in the same layer, and the touch functional layer 30 and the first cover plate 10 that are disposed in the same layer may be attached to a surface of the anti-reflection layer 40 away from the flexible display substrate 50 through the third adhesive layer 11.

For example, the second cover plate 20 may be attached to a surface of the touch functional layer 30 away from the anti-reflection layer 40 through a fourth adhesive layer 21, which may improve the connection reliability between the second cover plate 20 and the touch functional layer 30.

For example, the third adhesive layer 11 and the fourth adhesive layer 21 may also be made of the same material as the first adhesive layer 53, which may improve the connection reliability of the display module 100.

In some embodiments, as shown in FIG. 8, the display module 100 further includes a sealant 33. The sealant 33 is located between the touch functional layer 30 and the first cover plate 10 that are disposed in the same layer, and is bonded to the touch functional layer 30 and the first cover plate 10 in a sealing manner.

It will be noted that the sealant 33 may be an ultraviolet (UA) adhesive, which has properties of waterproof, corrosion resistance and light transmission, and is configured to fill a gap between the touch functional layer 30 and the first cover plate 10. The sealant 33 is filled between the touch functional layer 30 and the first cover plate 10, so that moisture and oxygen may be prevented from corroding the flexible display substrate from the gap between the touch functional layer 30 and the first cover plate 10, thereby improving the reliability of the structure of the display module.

In some embodiments, as shown in FIG. 9, the first cover plate 10 covers the portions of the flexible display substrate 50 located in the first region 100A and the second region 100B. Alternatively, as shown in FIG. 8, the first cover plate 10 covers the portion of the flexible display substrate 50 located in the first region 100A. For example, the first cover plate 10 covers both the first flat portion and the bending portion, of the flexible display substrate 50, that are located in the first region 100A.

In some embodiments, the second cover plate 20 covers a portion of the touch functional layer 30 located in the second region 100B.

In some examples, as shown in FIGS. 9 and 10, the first cover plate 10 covers portions of both the flexible display substrate 50 and the anti-reflection layer 40 located in the first region 100A and the second region 100B, and the second cover plate 20 covers the portion of the touch functional layer 30 located in the second region 100B. The second cover plate 20 is located on a side of the first cover plate 10 away from the anti-reflection layer 40. Alternatively, the second cover plate 20 is located on a side of the touch functional layer 30 away from the first cover plate 10.

For example, as shown in FIG. 10, the second cover plate 20 and the first cover plate 10 may be bonded through a fifth adhesive layer 22, which may improve the connection reliability between the second cover plate 20 and the first cover plate 10. Alternatively, as shown in FIG. 9, the second cover plate 20 and the touch functional layer 30 may be bonded through the fourth adhesive layer 21, which may improve the connection reliability between the second cover plate 20 and the touch functional layer 30.

The first cover plate 10 may protect the portion of both the anti-reflection layer 40 and the flexible display substrate 50 located in the first region 100A. Moreover, both the first cover plate 10 and the second cover plate 20 may protect the portion of both the anti-reflection layer 40 and the flexible display substrate 50 located in the second region 100B, and the second cover plate 20 may also protect the touch functional layer 30.

In some embodiments, as shown in FIGS. 2 and 4, the display module 100 further includes a first light-shielding ink 81 and/or a second light-shielding ink 82.

It will be noted that the material of the first light-shielding ink 81 and/or the second light-shielding ink 82 may be a mixture of black pigment and epoxy resin. The first light-shielding ink 81 is configured to block ambient light corresponding to a border of the first cover plate 10 from entering the display module 100, and the second light-shielding ink 82 is configured to block ambient light corresponding to a border of the second cover plate 20 from entering the display module 100. As a result, the influence of ambient light around the display module 100 on the display effect of the display module 100 may be reduced.

In some embodiments, as shown in FIG. 2, the first light-shielding ink 81 is located on a surface S11 of the first cover plate 10 proximate to the flexible display substrate 50, or located on a surface S12 of the first cover plate 10 away from the flexible display substrate 50. The first light-shielding ink 81 is located at least in the first region 100A, and an orthogonal projection of the first light-shielding ink 81 on the first cover plate 10 covers the border of the first region 100A. For example, in a case where the first cover plate 10 is located only in the first region 100A, the first light-shielding ink 81 is located at the border of the first region. For another example, in a case where the first cover plate 10 is located in the first region 100A and the second region 100B, the first cover plate 10 may be located at least part of borders of the first region 100A and the second region 100B.

In some embodiments, as shown in FIG. 2, the second light-shielding ink 82 is located on a surface S21 of the second cover plate 20 proximate to the flexible display substrate 50, or located on a surface S22 of the second cover plate 20 away from the flexible display substrate 50. The second light-shielding ink 82 is located in the second region 100B, and an orthogonal projection of the second light-shielding ink 82 on the second cover plate 20 covers the border of the second region 100B.

In some examples, the orthogonal projection of the first light-shielding ink 81 on the first cover plate 10 covers the border of the first region 100A, and the orthogonal projection of the second light-shielding ink 82 on the second cover plate 20 covers the border of the second region 100B.

In some embodiments, as shown in FIG. 2, the first light-shielding ink 81 and the second light-shielding ink 82 are disposed in different layers. The first light-shielding ink 81 and the second light-shielding ink 82 may separate the display region of the flexible display substrate 50, so that the flexible display substrate 50 may display different images in a partitioned manner.

In some examples, as shown in FIG. 2, the first light-shielding ink 81 is disposed on the surface of the first cover plate 10 away from the flexible display substrate 50, and is located at the border of the first region 100A; the second light-shielding ink 82 is disposed on the surface of the second cover plate 20 away from the first cover plate 10, and is located at the border of the second region 100B. In this way, an overlapping region of a region where the first light-shielding ink 81 is located and a region where the second light-shielding ink 82 is located will form a display dark region (i.e., a boundary between the first region 100A and the second region 100B), and the display dark region may separate the display region of the display module 100, so that the separated display regions may display different images, respectively. For example, in the case where the display module 100 is applied to the vehicle-mounted terminal device, the first region 100A may display a driving state of the driver collected by the optical sensor 200, and the second region 100B may display running data of the vehicle (e.g., vehicle speed, tire pressure or temperature inside the vehicle), which is convenient to display the driving state of the driver and the running data of the vehicle in the partitioned manner.

In some other examples, the first light-shielding ink 81 is located in the first region 100A and the second region 100B, and the first light-shielding ink 81 is disposed on the surface of the first cover plate 10 away from the flexible display substrate 50. The second light-shielding ink 82 is located in the second region 100B and is disposed on the surface of the second cover plate 20 away from the first cover plate 10.

In some other examples, the first light-shielding ink 81 is located in the first region 100A and is disposed on the surface of the first cover plate 10 proximate to the flexible display substrate 50. The second light-shielding ink 82 is located in the second region 100B and is disposed on the surface of the second cover plate 20 proximate to the first cover plate 10.

In some examples, as shown in FIG. 8, the sealant 33 is in contact with the second light-shielding ink 82.

In some embodiments, as shown in FIG. 3, a dimension DB of a portion of the display module 100 located in the second region 100B in a direction perpendicular to a portion of the flexible display substrate 50 located in the second region 100B is greater than a dimension DA of a portion of the display module 100 located in the first region 100A in a direction perpendicular to a portion of the flexible display substrate 50 in the first region 100A. In this way, a light transmittance of the portion of the display module 100 in the first region 100A is greater than a light transmittance of the portion of the display module 100 in the second region 100B.

In some examples, as shown in FIG. 3, in the first direction $Y_1$, the display module 100 includes, in the first region 100A, a portion of the first cover plate 10, a portion of the anti-reflection layer 40 and a portion of the flexible display substrate 50; and in the second direction $Y_2$, the display module 100 includes, in the second region 100B, a portion of the second cover plate 20, a portion of the touch functional layer 30, another portion of the first cover plate 10, another portion of the anti-reflection layer 40, and another portion the flexible display substrate 50. Since the display module 100 is not provided with portions of the second cover plate 20 and the touch functional layer 30 in the first region 100A, the dimension of the portion of the display module 100 located in the second region 100B in the second direction $Y_2$ is greater than the dimension of the portion of the display module 100 located in the first region 100A in the first direction $Y_1$. Therefore, it may eliminate the light loss caused by the second cover plate 20 and the touch functional layer 30, so that the light transmittance of the portion of the display module 100 located in the first region 100A is greater than the light transmittance of the portion of the display module 100 located in the second region 100B, and the amount of light collected by the optical sensor 200 located in the first region 100A may be improved. The first direction $Y_1$ is a direction perpendicular to the first flat portion of the flexible display substrate 50 located in the first region 100A, and the second direction $Y_2$ is a direction perpendicular to the second flat portion of the flexible display substrate 50 located in the second region 100B.

In some embodiments, as shown in FIG. 3, the display module 100 further includes a display driving chip 54. The display driving chip 54 is located on a back side of the flexible display substrate 50, and the display driving chip 54 is electrically connected to the flexible display substrate 50. The display driving chip 54 is configured to provide data signals for the flexible display substrate 50, so as to drive the flexible display substrate 50 to emit light and display.

For example, the display driving chip 54 may be integrated on a main flexible printed circuit board (M-FPC) or on a printed circuit board (PCB).

In some embodiments, as shown in FIG. 3, the display module 100 further includes a touch driving chip 31. The touch driving chip 31 is electrically connected to the touch functional layer 30. The touch driving chip 31 may be integrated on a touch flexible printed circuit board (T-FPC).

In some examples, the display driving chip 54 and the touch driving chip 31 may be integrated to be an integral structure. For example, the display driving chip 54 and the touch driving chip 31 may be integrated on the flexible circuit board (FPC).

In some examples, the display driving chip 54 and/or the touch driving chip 31 are located on a side of the support plate 60 away from the flexible display substrate 50.

In some embodiments, as shown in FIGS. 3 and 8, the display module 100 further includes a chip on film (COF) 55. An end of the COF 55 is coupled to a display circuit in the flexible display substrate 50, and another end thereof is bent towards the back side 50B of the flexible display substrate 50 and coupled to the display driving chip 54. Alternatively, an end of the COF 55 is coupled to the touch functional layer 30 in the flexible display substrate 50, and another end thereof is bent towards the back side 50B of the flexible display substrate 50 and coupled to the touch driving chip 31. The COF 55 may be bent to the back side 50B of the flexible display substrate 50, so that the display driving chip 54 and/or the touch driving chip 31 are disposed on the back side 50B of the flexible display substrate 50, thereby reducing a frame width of the display module 100 and increasing a screen-to-body ratio of the display module 100.

Figure 11:
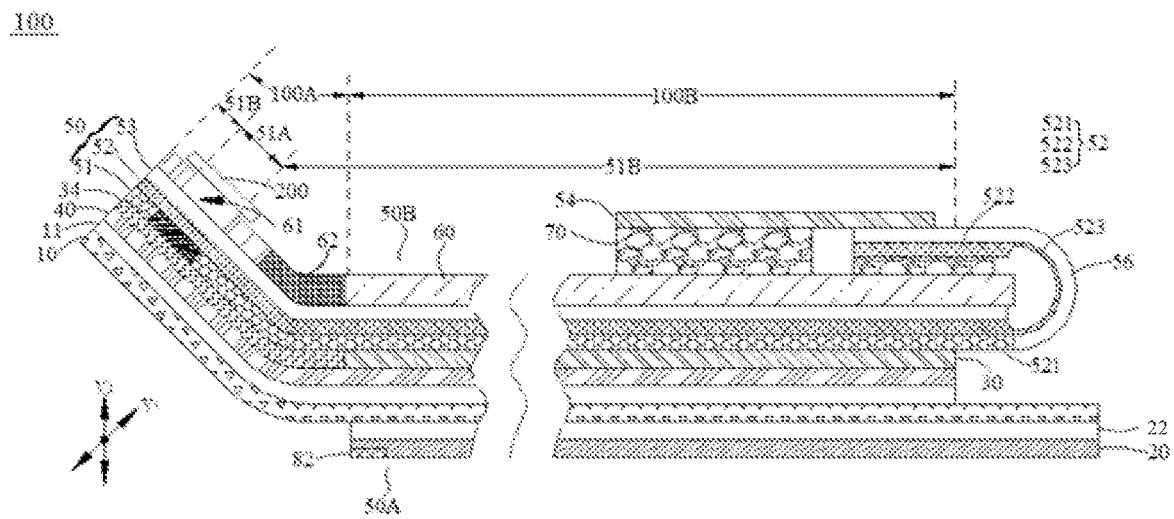
FIG. 11 is a sectional view of yet another display module, in accordance with some embodiments.

In some embodiments, as shown in FIGS. 9 and 11, the display module 100 further includes a chip on panel (COP) 56. An end of the COP 56 is coupled to the display circuit in the flexible display substrate 50, and another end thereof is bent towards the back side of the flexible display substrate 50 and coupled to the display driving chip 54. For example, the COP 56 and the flexible display substrate 50 may be connected to be an integral structure. The COP 56 may be bent towards the back side 50B of the flexible display substrate 50 as much as possible to be connected to the display driving chip 54, and the display driving chip 54 may be disposed on the back side 50B of the flexible display substrate 50 to avoid the frame of the display module 100 as much as possible. As a result, a narrow frame or even no frame may be realized for the display module 100, and the screen-to-body ratio of the display module 100 may be improved.

In some embodiments, as shown in FIGS. 9 and 11, the back film 52 includes a first film segment 521 attached to the display functional layer 51, a second film segment 522 located on the back side of the flexible display substrate 50, and a third film segment 523 connected between the first film segment 521 and the second film segment 522. A thickness of the third film segment 523 is less than a thickness of the first film segment 521 and/or less than a thickness of the second film segment 522, and the third film segment 523 of the back film 52 is not prone to be broken when being bent.

In some examples, as shown in FIG. 11, both the first film segment 521 and the second film segment 522 of the back film 52 are parallel to the flexible display substrate 50, and the third film segment 523 is a bending portion. The thicknesses of the first film segment 521 and the second film segment 522 of the back film 52 may be the same. Since the thickness of the third film segment 523 of the back film 52 is less than the thickness of the first film segment 521 and/or less than the thickness of the second film segment 522, the third film segment 523 of the back film 52 is not prone to be broken when being bent.

In some examples, as shown in FIG. 11, the first film segment 521 of the back film 52 is located in the first region 100A and the second region 100B, and the first film segment 521 of the back film 52 is attached to the back surface of the display functional layer 51. The second film segment 522 and the third film segment 523 of the back film 52 are both attached to the COP 56. The third film segment 523 is attached to a portion of the COP 56 bent towards the back side of the flexible display substrate 50, and the second film segment 522 is attached to a portion, of the COP 56, which is a portion of the COP 56 extending to be attached to a side of the support plate 60 away from the flexible display substrate 50 after the COP 56 is bent. The thickness of the third film segment 523 is less than the thickness of the first film segment 521 and/or less than the thickness of the second film segment 522, and a bending curvature of the third film segment 523 is greater than that of the COP 56. By thinning the third film segment 523 attached to a bending portion of the COP 56, the bending portion of the COP 56 becomes small, thereby narrowing the frame and increasing the screen-to-body ratio of the display module 100.

In some embodiments, as shown in FIG. 11, the display module 100 further includes a thermal insulation adhesive 70. The thermal insulation adhesive 70 is located between the support plate 60 and the display driving chip 54, and the thermal insulation adhesive 70 is configured to block heat of the display driving chip 54 from transferring to the flexible display substrate 50.

In some examples, the thermal insulation adhesive 70 may be an ultraviolet-curable (UV-curable) transparent adhesive, which undergoes polymerization and cross-linking reactions under the irradiation of ultraviolet light to change from a liquid state to a solid layer. The thermal insulation adhesive 70 may be disposed between the display driving chip 54 and the support plate 60 by coating or printing. The thermal insulation adhesive 70 is not only configured to block the heat of the display driving chip 54 from transferring to the flexible display substrate 50 through the support plate 60, but also configured to bond the display driving chip 54 to the support plate 60.

In some other examples, as shown in FIG. 11, the thermal insulation adhesive 70 may bond the second film segment 522 of the back film 52 to a surface on a side of the support plate 60 away from the flexible display substrate 50, and is configured to block the heat of the display driving chip 54 from transferring to the flexible display substrate 50 through the back film 52 and the support plate 60.

In some embodiments, as shown in FIG. 11, the support plate 60 includes a bending support portion 62. The bending support portion 62 is located at a position where the first region 100A is proximate to the second region 100B, and is bent towards the direction away from the display side 50A of the flexible display substrate 50.

Figure 12:
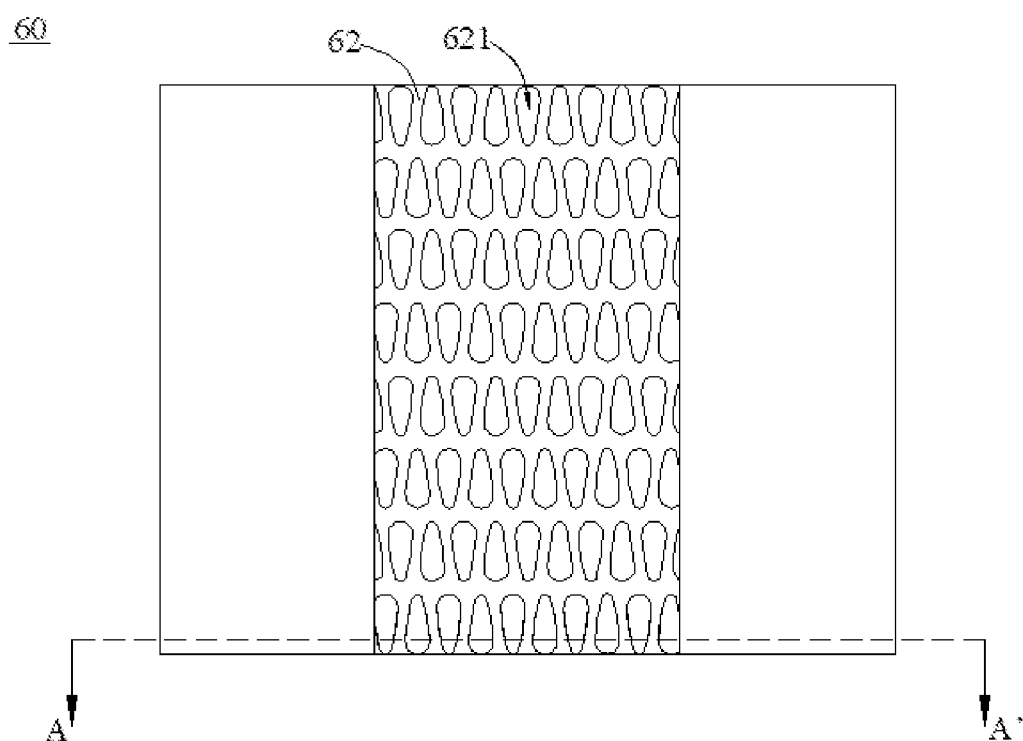
FIG. 12 is a structural diagram of a bending support portion in a support plate, in accordance with some embodiments.
Figure 13A:
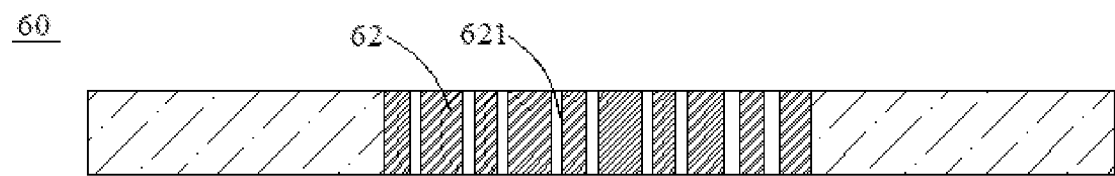
FIG. 13A is a sectional view taken along the A-A' direction in FIG. 12.
Figure 13B:
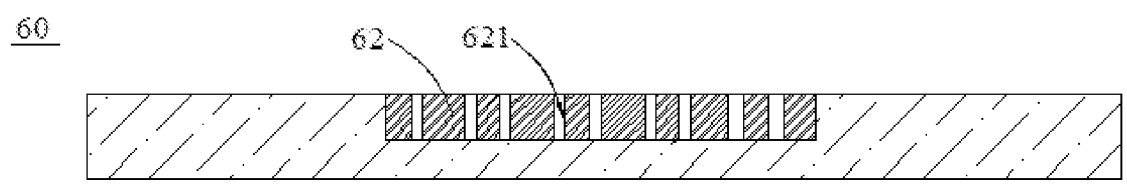
FIG. 13B is another sectional view taken along the A-A' direction in FIG. 12.
Figure 13C:
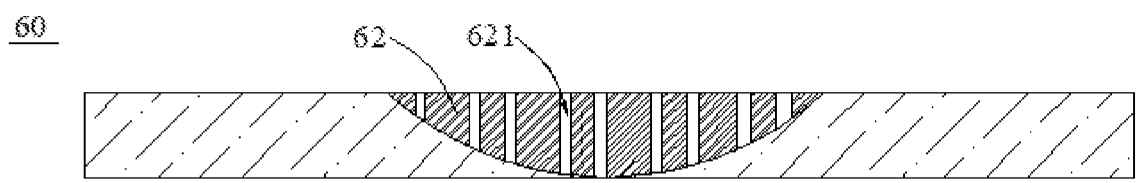
FIG. 13C is yet another sectional view taken along the A-A' direction in FIG. 12.

As shown in FIG. 12, the bending support portion 62 is provided with a concave structure 621 therein, and the concave structure 621 may reduce an internal stress of the bending support portion 62 due to bending when the support plate 60 is bent, so that the bending support portion 62 is not prone to be broken when being bent. The concave structure 621 may be a structure including one or more through holes and/or blind holes. For example, as shown in FIG. 13A, the concave structure 621 may be a structure including a plurality of through holes. Alternatively, as shown in FIG. 13B, the concave structure 621 may be a structure including a plurality of blind holes. Alternatively, as shown in FIG. 13C, the concave structure 621 may be a structure including a plurality of blind holes and a plurality of through holes. The blind hole and the through hole may have the same or different shapes. For example, the blind hole and the through hole may each have an elliptical, a circular or a long-strip shape.

In summary, for the display module provided by the embodiments of the present disclosure, the light transmittance of the portion of the display module in the light-transmitting display region 51A is greater than the light transmittance of the portion of the display module in the main display region 51B, and the touch functional layer 30 exposes at least part of the light-transmitting display region 51A. Therefore, the amount of light transmitted through the light-transmitting display region 51A may increase, so that the amount of light passing through the light-transmitting display region 51A and reaching the optical sensor 200 may increase, and the clarity of the image collected by the optical sensor 200 may be improved.

Figure 14:
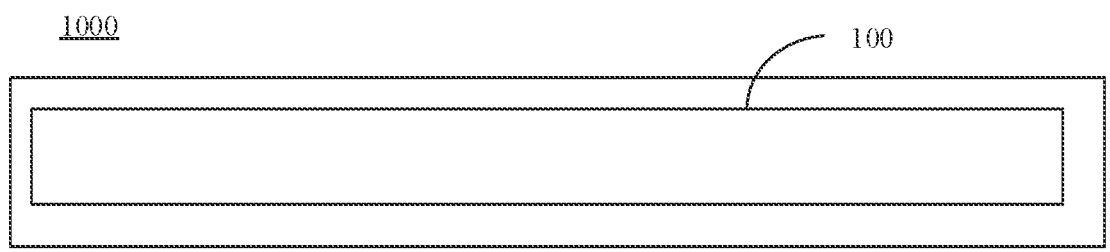
FIG. 14 is a structural diagram of a terminal device, in accordance with some embodiments.

As shown in FIGS. 2 and 14, the embodiments of the present disclosure further provide a terminal device 1000. The terminal device 1000 includes the display module 100 as described in any of the above embodiments.

The terminal device is a product that has a function of displaying images (including static images or dynamic images, where the dynamic images may be videos). For example, the terminal device may be any one of a television, a mobile phone, a picture screen, a digital camera, a camcorder, a viewfinder, a large-area screen and a monitor. For another example, the terminal device may also be a micro-display.

In a case where the terminal device provided by the embodiments of the present disclosure is applied in a vehicle as a vehicle-mounted display terminal device, the terminal device provided by the embodiments of the present disclosure may display entertainment audio-visual programs in the second region 100B, and display a navigation map information image in the first region 100A. In addition, the optical sensor 200 in the first region 100A may monitor the driving state of the driver or the riding conditions of other passengers in real time. For example, the optical sensor 200 may monitor the driver's facial expression in real time.

In a case where the terminal device provided by the embodiments of the present disclosure is applied in an aircraft or high-speed train as a display terminal device with control functions, the terminal device provided by the embodiments of the present disclosure may display different operating data of the aircraft or high-speed train in the second region 100B and the first region 100A. For example, the temperature and humidity in the cabin are displayed in the second region 100B, and the driving direction and station information are displayed in the first region 100A. In addition, the optical sensor 200 in the first region 100A may monitor the operating state of the flight crew or the riding conditions of the passengers in real time.

In a case where the terminal device provided by the embodiments of the present disclosure is applied in a shopping mall as an information notice display terminal device, the terminal device provided by the embodiments of the present disclosure may display notice contents such as commodity price information, commodity position information, service information and fire lane position information in the first region 100A and the second region 100B. In addition, the optical sensor 200 in the first region 100A may monitor the conditions of the staff and consumers in the mall in real time.

In a case where the terminal device provided by the embodiments of the present disclosure is applied in a restaurant as an information notice display terminal device, the terminal device provided by the embodiments of the present disclosure may display contents such as menu information, bill settlement information and service reminder information in the second region 100B, and display payment prompt information in the first region 100A. In addition, the optical sensor 200 in the first region 100A may be used to collect the payment code information provided by the customer to complete the collection.

The light transmittance of the portion of the display module 100 in the light-transmitting display region 51A is greater than that of the portion of the display module 100 in the main display region 51B, and the touch functional layer 30 exposes at least part of the portion of the flexible display substrate 50 located in the light-transmitting display region 51A. Therefore, the terminal device provided by the embodiments of the present disclosure has greater light transmittance in the light-transmitting display region 51A than in the main display region 51B.

In summary, the terminal device provided by the embodiments of the present disclosure includes the display module 100 described in any of the above embodiments, thus it has the beneficial effects of the display module 100 described in any of the above embodiments, and details will not be repeated here.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:
a flexible display substrate having a light-transmitting display region and a main display region, the main display region being located on at least one side of the light-transmitting display region, wherein a light transmittance of a portion of the flexible display substrate located in the light-transmitting display region is greater than a light transmittance of a portion of the flexible display substrate located in the main display region; and
a touch functional layer located on a display side of the flexible display substrate, wherein the touch functional layer exposes at least part of the portion of the flexible display substrate located in the light-transmitting display region; and
the display module having:
a first region, the display module being bent towards a direction away from the display side of the flexible display substrate in the first region; and
a second region disposed adjacent to the first region, wherein
the light-transmitting display region of the flexible display substrate is located in the first region, and the main display region of the flexible display substrate is located in both the second region and a region in the first region other than the light-transmitting display region.

2. The display module according to claim 1, wherein the touch functional layer covers at least part of the portion of the flexible display substrate located in the main display region, and exposes the portion of the flexible display substrate located in the light-transmitting display region.

3. The display module according to claim 1, wherein the flexible display substrate includes a plurality of sub-pixels; and
a distance between two adjacent sub-pixels in the light-transmitting display region is larger than a distance between two adjacent sub-pixels in the main display region.

4. The display module according to claim 1, wherein the flexible display substrate includes a plurality of sub-pixels, and each sub-pixel includes a light-emitting device and a pixel circuit coupled to the light-emitting device; and
at least some of pixel circuits respectively coupled to light-emitting devices located in the light-transmitting display region are located in the main display region.

5. The display module according to claim 1, further comprising:
a light-transmitting film covering a portion of the flexible display substrate located in the first region, wherein
the touch functional layer covers a portion of the flexible display substrate located in the second region, and the touch functional layer and the light-transmitting film are disposed in a same layer.

6. The display module according to claim 1, further comprising:
an anti-reflection layer disposed on the display side of the flexible display substrate, wherein
the touch functional layer is located between the anti-reflection layer and the flexible display substrate.

7. The display module according to claim 1, further comprising:
an anti-reflection layer disposed on the display side of the flexible display substrate, wherein
the touch functional layer is located on a side of the anti-reflection layer away from the flexible display substrate, and covers a portion of the flexible display substrate located in the second region.

8. The display module according to claim 1, further comprising:
a first cover plate located on the display side of the flexible display substrate, and covering a portion of the flexible display substrate located in the first region, wherein
the first cover plate is disposed on a same layer as the touch functional layer.

9. The display module according to claim 8, further comprising:
a sealant located between the touch functional layer and the first cover plate, and bonded to the touch functional layer and the first cover plate in a sealing manner.

10. The display module according to claim 1, further comprising:
a first cover plate located on the display side of the flexible display substrate and covering portions of the flexible display substrate located in the first region and the second region.

11. The display module according to claim 1, further comprising:
a first cover plate located on the display side of the flexible display substrate, the first cover plate covering a portion of the flexible display substrate located in the first region or covering portions of the flexible display substrate located in the first region and the second region; and
a first light-shielding ink located on a surface of the first cover plate proximate to the flexible display substrate, or located on a surface of the first cover plate away from the flexible display substrate, wherein
the first light-shielding ink is located at least in the first region, and an orthogonal projection of the first light-shielding ink on the first cover plate covers a border of the first cover plate.

12. The display module according to claim 1, further comprising:
a second cover plate located on the display side of the flexible display substrate and covering a portion of the touch functional layer located in the second region.

13. The display module according to claim 12, further comprising:
a second light-shielding ink located on a surface of the second cover plate proximate to the flexible display substrate, or located on a surface of the second cover plate away from the flexible display substrate, wherein
the second light-shielding ink is located in the second region, and an orthogonal projection of the second light-shielding ink on the second cover plate covers a border of the second cover plate.

14. The display module according to claim 13, further comprising:
a first cover plate located on the display side of the flexible display substrate, the first cover plate covering a portion of the flexible display substrate located in the first region or covering portions of the flexible display substrate located in the first region and the second region; and
a first light-shielding ink located on a surface of the first cover plate proximate to the flexible display substrate, or located on a surface of the first cover plate away from the flexible display substrate, wherein
the first light-shielding ink is located at least in the first region, and an orthogonal projection of the first light-shielding ink on the first cover plate covers a border of the first cover plate; and
the first light-shielding ink and the second light-shielding ink are disposed in different layers.

15. The display module according to claim 1, wherein a dimension of a portion of the display module located in the second region in a direction perpendicular to a portion of the flexible display substrate in the second region is greater than a dimension of a portion of the display module located in the first region in a direction perpendicular to a portion of the flexible display substrate in the first region.

16. The display module according to claim 1, further comprising:
a display driving chip located on a back side of the flexible display substrate; and
a chip on film, an end thereof being coupled to the flexible display substrate, and another end thereof being bent towards the back side of the flexible display substrate and coupled to the display driving chip.

17. The display module according to claim 1, further comprising:
a display driving chip located on a back side of the flexible display substrate; and
a chip on panel, an end thereof being coupled to the flexible display substrate, and another end thereof being bent towards the back side of the flexible display substrate and coupled to the display driving chip; and
the chip on panel and the flexible display substrate being connected to be an integral structure.

18. The display module according to claim 17, wherein the flexible display substrate includes:
a display functional layer configured to emit light for display; and
a back film located on a back surface of the display functional layer, wherein the back film including a first film segment attached to the display functional layer, a second film segment located on the back side of the flexible display substrate, and a third film segment connected between the first film segment and the second film segment; a thickness of the third film segment is less than a thickness of the first film segment and/or the thickness of the third film segment is less than a thickness of the second film segment.

19. The display module according to claim 1, further comprising:
a support plate disposed on a back side of the flexible display substrate, wherein
the support plate includes a bending support portion; the bending support portion is located at a position where the first region is proximate to the second region, and is bent towards the direction away from the display side of the flexible display substrate; and the bending support portion is provided with a concave structure therein.

20. A terminal device, comprising:
the display module according to claim 1.

* * * * *